United States Patent
Gorell

(10) Patent No.: US 9,594,483 B2
(45) Date of Patent: Mar. 14, 2017

(54) METHOD AND SYSTEM OF PLOTTING CORRELATED DATA

(71) Applicant: Landmark Graphics Corporation, Houston, TX (US)

(72) Inventor: Sheldon B. Gorell, Katy, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 176 days.

(21) Appl. No.: 14/270,460

(22) Filed: May 6, 2014

(65) Prior Publication Data

US 2014/0245211 A1 Aug. 28, 2014

Related U.S. Application Data

(63) Continuation of application No. 13/877,817, filed as application No. PCT/US2010/060681 on Dec. 16, 2010, now Pat. No. 8,786,604.

(51) Int. Cl.
| | |
|---|---|
| G06T 11/20 | (2006.01) |
| G06F 3/0484 | (2013.01) |
| G01V 1/34 | (2006.01) |
| G01V 99/00 | (2009.01) |
| G06F 17/50 | (2006.01) |
| G06F 3/0481 | (2013.01) |
| G06F 3/0482 | (2013.01) |

(52) U.S. Cl.
CPC .......... *G06F 3/04842* (2013.01); *G01V 1/345* (2013.01); *G01V 99/005* (2013.01); *G06F 3/0482* (2013.01); *G06F 3/04815* (2013.01); *G06F 17/5009* (2013.01)

(58) Field of Classification Search
CPC .................................................. G06F 3/04842
USPC ........................................................ 345/440
See application file for complete search history.

(56) References Cited

U.S. PATENT DOCUMENTS

| | | | |
|---|---|---|---|
| 6,018,497 A | 1/2000 | Gunasekera | |
| 6,106,561 A * | 8/2000 | Farmer | G01V 1/282 |
| | | | 345/423 |
| 6,549,854 B1 * | 4/2003 | Malinverno | G01V 1/282 |
| | | | 367/73 |
| 6,766,255 B2 | 7/2004 | Stone | |
| 7,006,959 B1 | 2/2006 | Huh et al. | |

(Continued)

OTHER PUBLICATIONS

International Search Report and Written Opinion issued Jul. 28, 2011 in International Patent Application No. PCT/US2010/060681. (10 pages).

(Continued)

*Primary Examiner* — Javid A Amini

(57) ABSTRACT

Plotting correlated data. At least some of the illustrative embodiments are methods including: displaying on a display system of a computer system a two-dimensional plot of output data related to an earth formation, the output data estimated from a model of the earth formation, and the volume plotted relative to modeled time; placing a cursor shown on the display system over a first portion of the two-dimensional plot, the first portion corresponding to a first modeled time; and displaying on the display system a three-dimensional plot of respective values of a parameter from a plurality of cells of the model of the earth formation, the respective values at the first modeled time.

21 Claims, 9 Drawing Sheets

(56) References Cited

U.S. PATENT DOCUMENTS

| | | | |
|---|---|---|---|
| 7,254,091 B1* | 8/2007 | Gunning | G01V 11/00 367/73 |
| 7,689,394 B2* | 3/2010 | Furem | E02F 9/267 703/8 |
| 7,881,878 B2* | 2/2011 | Burrus | G01R 33/56341 600/410 |
| 8,291,069 B1* | 10/2012 | Phillips | G06F 17/18 375/341 |
| 2002/0169785 A1 | 11/2002 | Netemeyer et al. | |
| 2004/0044479 A1* | 3/2004 | Sansone | G01V 1/28 702/16 |
| 2005/0209866 A1* | 9/2005 | Veeningen | G06Q 10/06 705/7.28 |
| 2006/0104158 A1* | 5/2006 | Walls | G01V 1/30 367/73 |
| 2006/0129366 A1* | 6/2006 | Shaw | E21B 49/006 703/10 |
| 2007/0116347 A1* | 5/2007 | Hong | G06T 7/0087 382/131 |
| 2007/0183260 A1 | 8/2007 | Lee et al. | |
| 2007/0219765 A1* | 9/2007 | Calvert | G01V 1/282 703/6 |
| 2007/0246994 A1 | 10/2007 | Kaminsky et al. | |
| 2008/0065362 A1 | 3/2008 | Lee et al. | |
| 2009/0119076 A1* | 5/2009 | Madatov | G01V 1/282 703/2 |
| 2009/0125240 A1 | 5/2009 | den Boer et al. | |
| 2009/0125288 A1 | 5/2009 | Main et al. | |
| 2009/0248378 A1* | 10/2009 | Li | G01V 1/282 703/10 |
| 2009/0287416 A1 | 11/2009 | Minh | |
| 2010/0007665 A1* | 1/2010 | Smith | G06T 13/40 345/473 |
| 2010/0036614 A1* | 2/2010 | Zuercher | G01V 1/288 702/16 |
| 2010/0089575 A1 | 4/2010 | Kaminsky et al. | |
| 2010/0138157 A1 | 6/2010 | Sun et al. | |
| 2010/0204972 A1* | 8/2010 | Hsu | E21B 49/006 703/10 |
| 2010/0254914 A1 | 10/2010 | Park et al. | |
| 2011/0030465 A1 | 2/2011 | Smalley | |
| 2011/0119040 A1 | 5/2011 | McLennan | |
| 2011/0191080 A1 | 8/2011 | Klie | |
| 2011/0295508 A1 | 12/2011 | Lee | |
| 2012/0117124 A1* | 5/2012 | Bruaset | G06F 17/30327 707/797 |
| 2012/0158310 A1 | 6/2012 | Adams et al. | |
| 2015/0000374 A1* | 1/2015 | Romanak | G01M 3/226 73/23.35 |
| 2015/0269785 A1* | 9/2015 | Bell | G06T 19/003 345/427 |

OTHER PUBLICATIONS

Halliburton Energy Services, Inc. "StratWorks 3D Geologic Software—Halliburton." www.halliburton.com. Accessed Jan. 5, 2011. (2 pages).

Jacynthe Pouliot, et al. "Reasoning about geological space: Coupling 3D GeoModels and topological queries as an aid to spatial data selection" Computers & Geosciences 34 (2008) 529-541.

* cited by examiner

//////

METHOD AND SYSTEM OF PLOTTING CORRELATED DATA

CROSS-REFERENCE TO RELATED APPLICATIONS

This application is a continuation of U.S. patent application Ser. No. 13/877,817 filed Apr. 4, 2013, titled "Method and System of Plotting Correlated Data" (now U.S. Pat. No. 8,786,604). The Ser. No. 13/877,817 application claims priority to PCT Application No. PCT/US2010/060681, filed Dec. 16, 2010, titled "Method and System of Plotting Correlated Data." These applications are incorporated by reference herein as if reproduced in full below.

BACKGROUND

In order to optimize borehole placement and hydrocarbon extraction from an underground formation, a model of the formation may be created. Using the model, many simulations are performed with varying parameters, the varying parameters such as injection well placement, extraction well placement, and type and volume of secondary recovery fluid extraction. Although many parameters may be plotted and analyzed, in many cases the parameter of interest is hydrocarbon production from the formation.

In evaluating the modeled hydrocarbon production, an analyst may want to see the state of the formation model at the point in time of interest. However, in many cases it is difficult to identify and/or locate the earth model parameters that resulted in a particular hydrocarbon volume at a particular modeled time. For example, the analyst may be able to find from the data an indication of the simulation number, but then the analyst must be able to locate the data associated with the simulation, locate the output information and/or files which contain the output information and then invoke another program which displays a visual representation of the data and/or simulation results. The analyst could be working simultaneously with a range of models numbering from just a few hundreds or even thousands of simulation models. Even for a well organized analyst, when working with multiple models it may take ten minutes or more to find and plot the underlying simulation data. Moreover, the software package used to display the modeled hydrocarbon production is generally not the same as the software package used to display the underlying simulation data from the model, and thus it is difficult to correlate state of the underlying model (or models) at a particular modeled time as between the software package displaying the results and the software package displaying the underlying model parameters.

Any advance which shortens the time to find, display, and correlate output results to underlying model parameters would thus provide a competitive advantage.

BRIEF DESCRIPTION OF THE DRAWINGS

For a detailed description of exemplary embodiments, reference will now be made to the accompanying drawings in which.

NOTATION AND NOMENCLATURE

Certain terms are used throughout the following description and claims to refer to particular components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"Display system" shall mean a single display device, or multiple display devices, coupled in such a way that a processor can directed or indirectly manipulate text and graphics displayed on the single device or multiple devices.

"Display . . . as a three-dimensional plot" shall mean that the underlying object displayed has a three-dimensional character, and the fact that in some cases the object with three-dimensional character is projected onto a two-dimensional surface of a display device shall not obviate status as three-dimensional.

"Real time" shall mean that an action takes place within one second of a triggering event.

"Time", with respect to modeled parameters, shall mean modeled future or past time, as the context dictates, and shall not necessarily refer to actual time.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to systems and related methods of displaying output data associated with one or more model(s) of an earth formation, and correlating the output data to the underlying state of the model of the earth formation from which the output data was produced.

Figure 1:
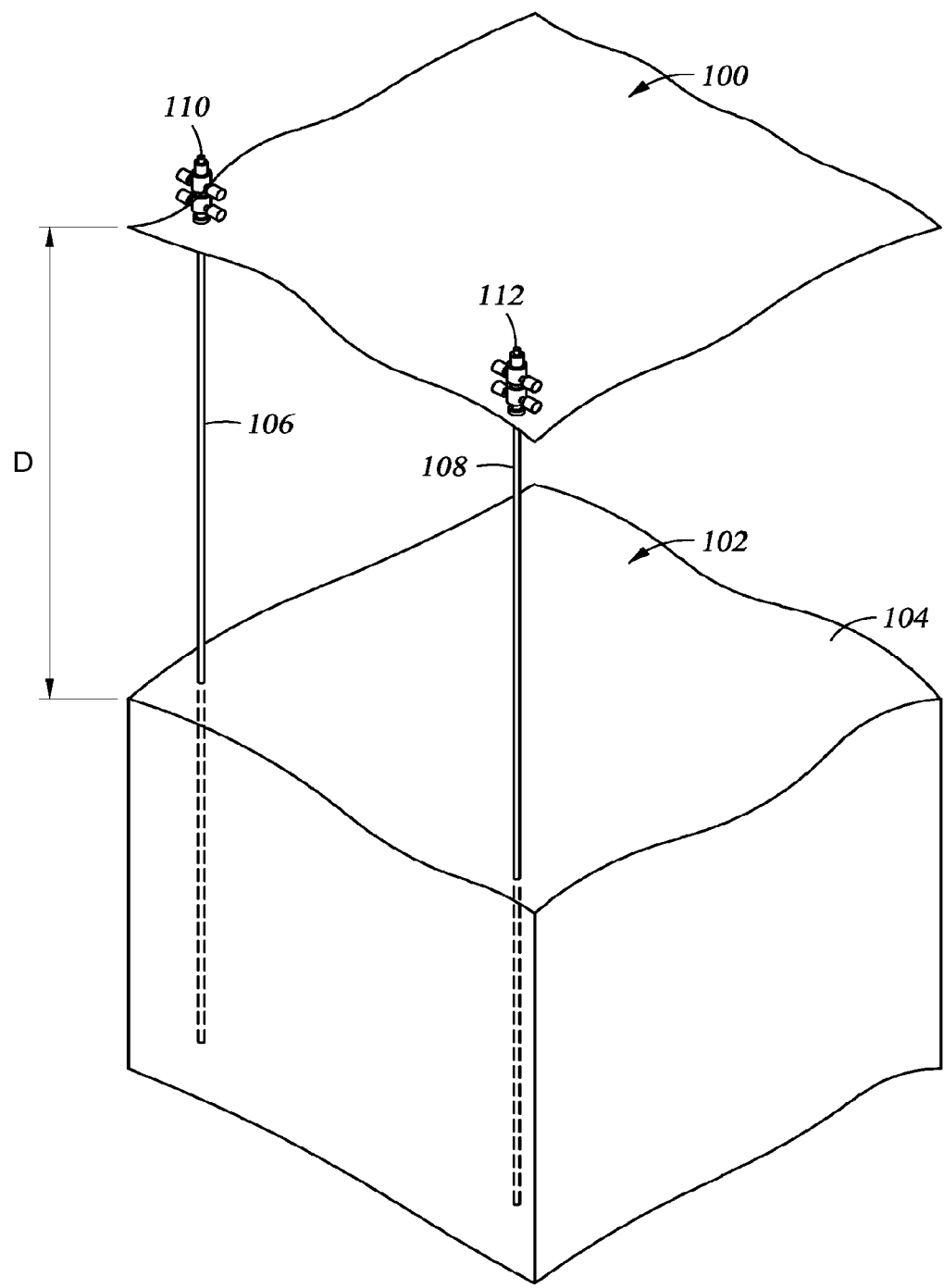
FIG. 1 shows a perspective cut-away view of a hydrocarbon bearing formation.

FIG. 1 shows a cross-sectional perspective view of a portion of the surface of the earth as well as an underlying formation. In particular, FIG. 1 shows a portion of the surface 100 of the earth and an underlying hydrocarbon bearing formation 102 (hereafter just "formation 102"). The formation 102 resides at some distance D below the surface, and the overburden between the surface 100 and the top 104 of the formation 102 is not shown in FIG. 1. The precise shape of the formation 102, while illustrated as approximately rectangular, will in actuality be determined by a variety of factors such as faulting, depositional environment, differential compaction, location of an impervious rock layer above the formation 102, and angle of the impervious rock layer with respect to the surface. One or more boreholes 106 and 108 may be drilled from the surface 100 into the formation 102. The illustrative boreholes are displayed as vertical, but they can have any geometry. The illustrative boreholes 106 and 108 in FIG. 1 include wellheads 110 and 112, signifying that these illustrative boreholes 106 and 108 have already been completed.

However, before significant hydrocarbon extraction begins, the owner or operator may want to determine or devise a hydrocarbon extraction technique which results in the best overall drainage of the hydrocarbons from the formation 102. The hydrocarbon extraction technique may take many forms, such as drilling additional boreholes, withdrawing the hydrocarbons from particular portions of the formation 102 prior to other portions of the formation 102, and the use of secondary recovery fluid injection (e.g., water injection, natural gas injection, carbon dioxide injection). In order to select the extraction technique ultimately used, a plurality of extraction techniques and/or model parameters may be evaluated by use of formation models.

Figure 2:
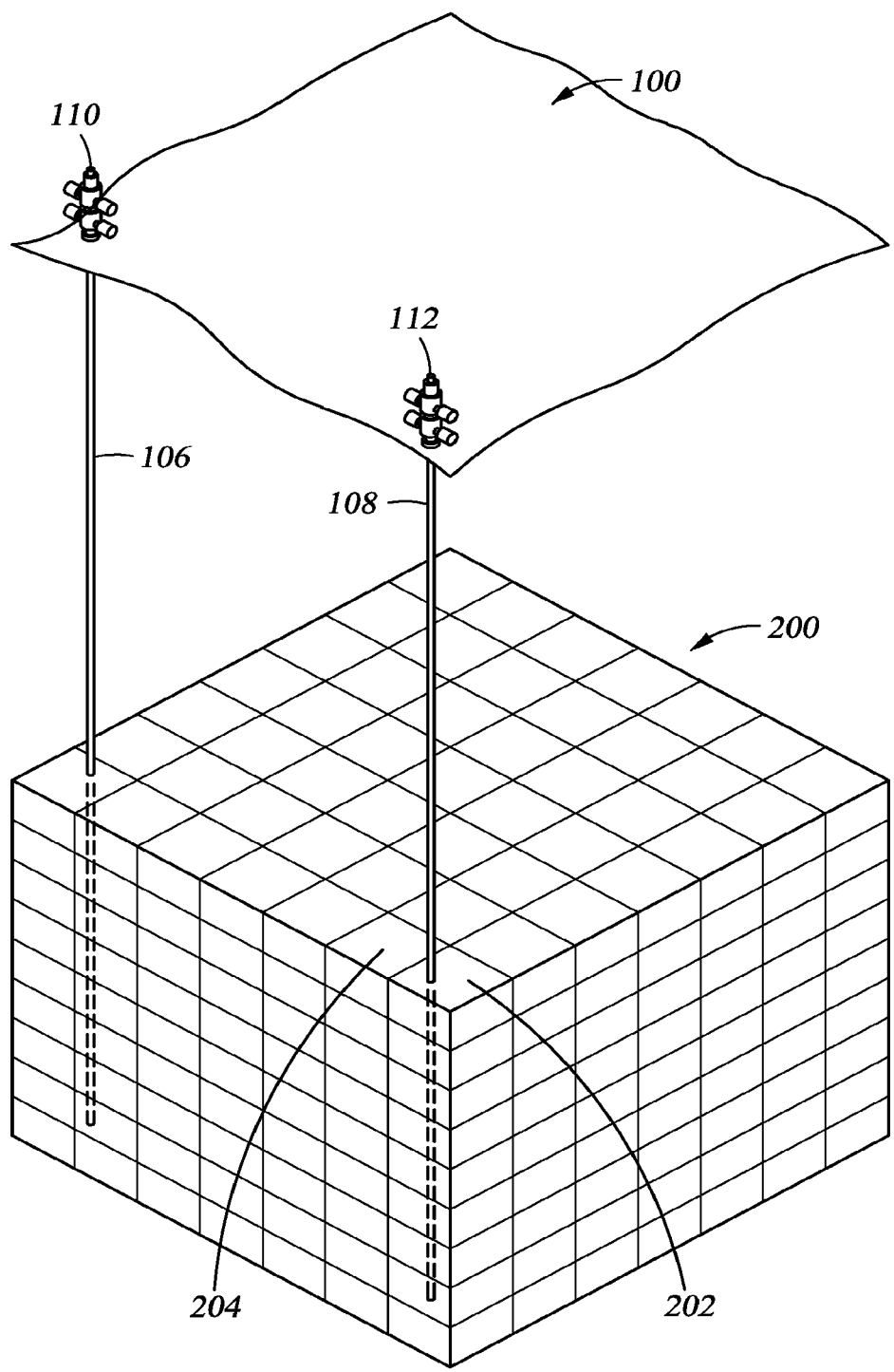
FIG. 2 shows a perspective view of a model of a hydrocarbon bearing formation.

In accordance with at least some embodiments some or all of an underground hydrocarbon bearing formation may be modeled by the use of a geocellular model. FIG. 2 shows a perspective view of an illustrative geocellular model. In particular, FIG. 2 shows the surface 100, as well as a geocellular model 200 of the formation 102. As the name implies, a geocellular model comprises a plurality of cells, for example cell 202 and cell 204, where all the cells considered together approximate the physical extent of the formation 102 (or a relevant section). As illustrated in FIG. 2, the cells 202 and 204 are rectangular, and all the cells are of equal volume; however, shape of the cells, and volume represented by each cell, may change for each particular situation. For example, in portions of the formation known to have significant hydrocarbon impregnation, the cell volumes may be relatively small so that hydrocarbon movement may be more accurately modeled or simulated. Locations in the formation that have very little hydrocarbon impregnation, or which are a great distance from planned or actual injection wells and/or extraction wells, may have larger volume as the precise hydrocarbon movement through these cells may have less of an impact on the overall simulation.

It is to be understood that each cell (e.g., cells 202 and 204) is a mathematical construct, not a physical construct. The illustration of FIG. 2 showing the model 200 under the surface 100 is merely to orient the reader to the idea of a geocellular model representing or modeling a formation 102. Each cell "contains" is made up of information regarding the portion of the formation represented by that cell. For example, each cell may contain a value indicative of the porosity of the formation represented by the cell. Each cell may contain an indication of the permeability of the formation represented by the cell. Each cell may contain an indication of hydrocarbon saturation of a portion of the formation represented by the cell. Each cell may contain an indication of the oil-to-gas saturation of the portion of the formation represented by the cell. Using the model 200 then, response of the real formation 102 may be simulated by the model 200 for many different extraction techniques. For example, the model 200 may be used to estimate the volume of fluid extracted from borehole 106 in response to pumping of a secondary recovery fluid into the formation through borehole 108.

Any of a variety of output data may be created by simulations using the model 200. For example, the model 200 may estimate hydrocarbon production as a function of modeled time (e.g., 15 and 30 years in the future). The model 200 may be used to estimate water production as a function of modeled time. The model 200 may be used to estimate natural gas production as a function of modeled time. The model 200 may be used to estimate oil production as a function of modeled time. The model 200 may be used to estimate the production of secondary recovery fluid as a function of modeled time.

Applying the model 200 to a particular series of modeling circumstances generates a large amount of data. For purposes of this specification and claims, the data generated falls into three distinct categories: input data, output data; and state data. Input data refers to data or parameters that are used to generate a model. Output data refers to data that predicts how a reservoir or formation will perform subject to injection and/or production of fluids. Examples of output data include the volume of fluids that are produced by the formation from one more locations (e.g., hydrocarbon production, oil production, gas production, production of secondary fluids injected in the formation at other locations). The list of specific fluids is merely illustrative, and not intended to be an exhaustive list. Distinct from the output data produced by the model is the state data representing the various parameters within each cell 202 and 204. For example, if the model 200 simulates response of the formation 102 to injection of a secondary recovery fluid into the borehole 108, for each distinct point in the modeled time from the beginning of the simulation to the end of the simulation each cell will have changing and different parameters. The amount of change will be dependant upon the location of the cell in reference to the illustrative injection point, with greater changes from each point in modeled time for cells close to the illustrative injection point, and less change for each point in modeled time for cells a great distance from the illustrative injection point. However, the distinct data representing state of each cell at each modeled time increment in the simulation represent the state of the gecellular model 200.

Figure 3:
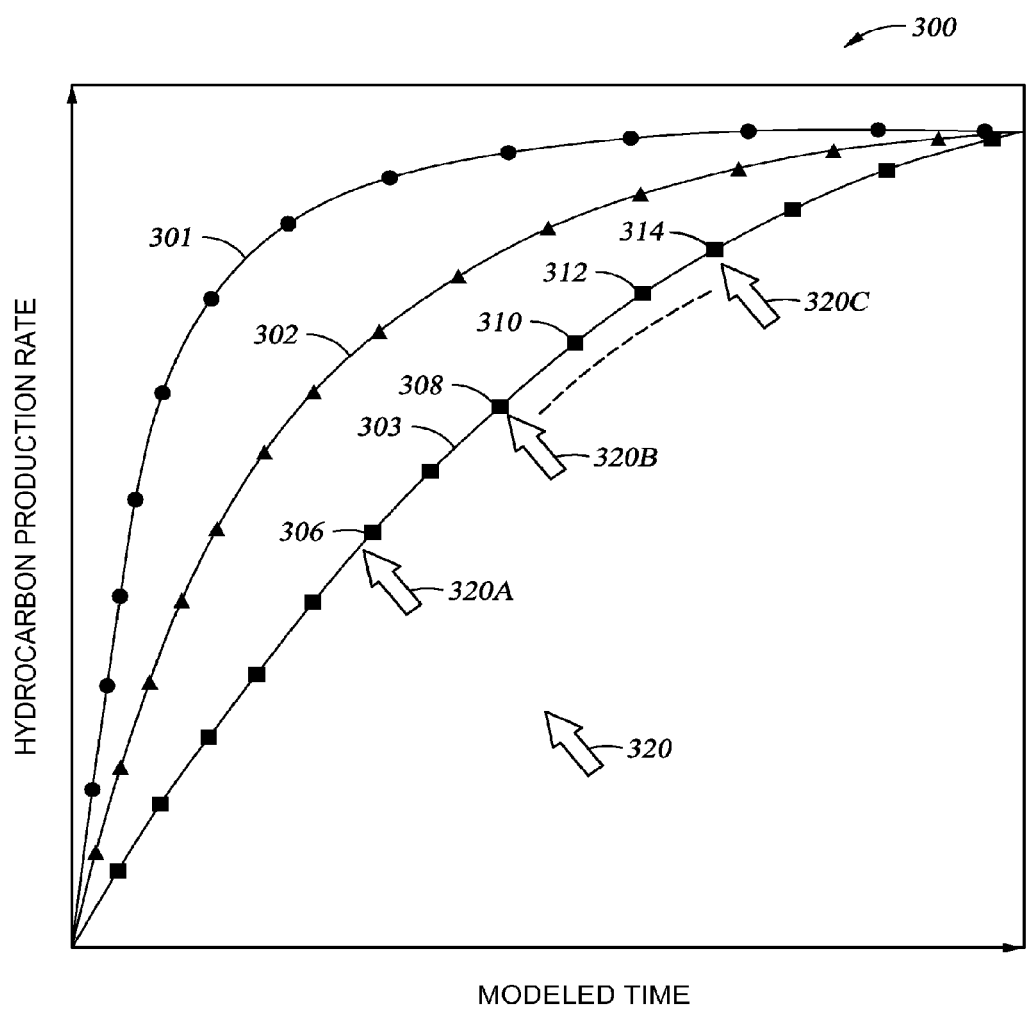
FIG. 3 shows a plot of output data in accordance with at least some embodiments.

FIG. 3 shows an illustrative plot of output data from multiple simulation runs of the model 200. In particular, FIG. 3 shows output data from three simulations 301, 302, and 303 co-plotted in the same pane 300. Any of a variety of software packages may be used to display and analyze output data generated by a formation model, such as the SPOTFIRE® brand products available from Tibco Software, Inc., of Palo Alto, Calif. In the illustrative example of FIG. 3, the output data from the first simulation 301 (each datum represented by a dot) illustratively represents hydrocarbon production rate along the vertical axis indexed against modeled time along the horizontal axis. Each datum of the data of the illustrative simulation 302 is represented by triangles, and each datum of the output data represented of the illustrative simulation 304 is represented by squares. It is to be understood that the three curves of FIG. 3 are merely illustrative. Analysts in some situations may deal with hundreds or thousands of simulation runs, and thus may be simultaneously viewing hundreds or thousands of curves, in many cases with data generated from multiple, different programs. FIG. 3 shows only three curves to convey specific interaction techniques without unduly complicating the figure.

Any of a variety of parameter changes may have resulted in the differences between simulations 301, 302 and 303. For example, the underlying model description (e.g., porosity, permeability, saturations) may be different as between the simulations, or the rate of injection of a secondary recovery fluid at an injection well may have been greater for the simulation 301 than the rate of secondary recovery fluid injection for the simulation 303. Regardless of the differences in parameters applied to each simulation, an analyst may compare the illustrative output data over the various, in this example, three simulations by viewing the curves shown in FIG. 3. In some cases, the decision to be made regarding a particular extraction technique can be determined purely from viewing the illustrative output data, such as shown in FIG. 3. However, in other situations the analyst may want to better understand the response of the formation model that results in the particular output data shown in FIG. 3. For example, the analyst may want to see the state of the geocellular model at the point in modeled time indicated by the datum 306 in the simulation 303.

Figure 4:
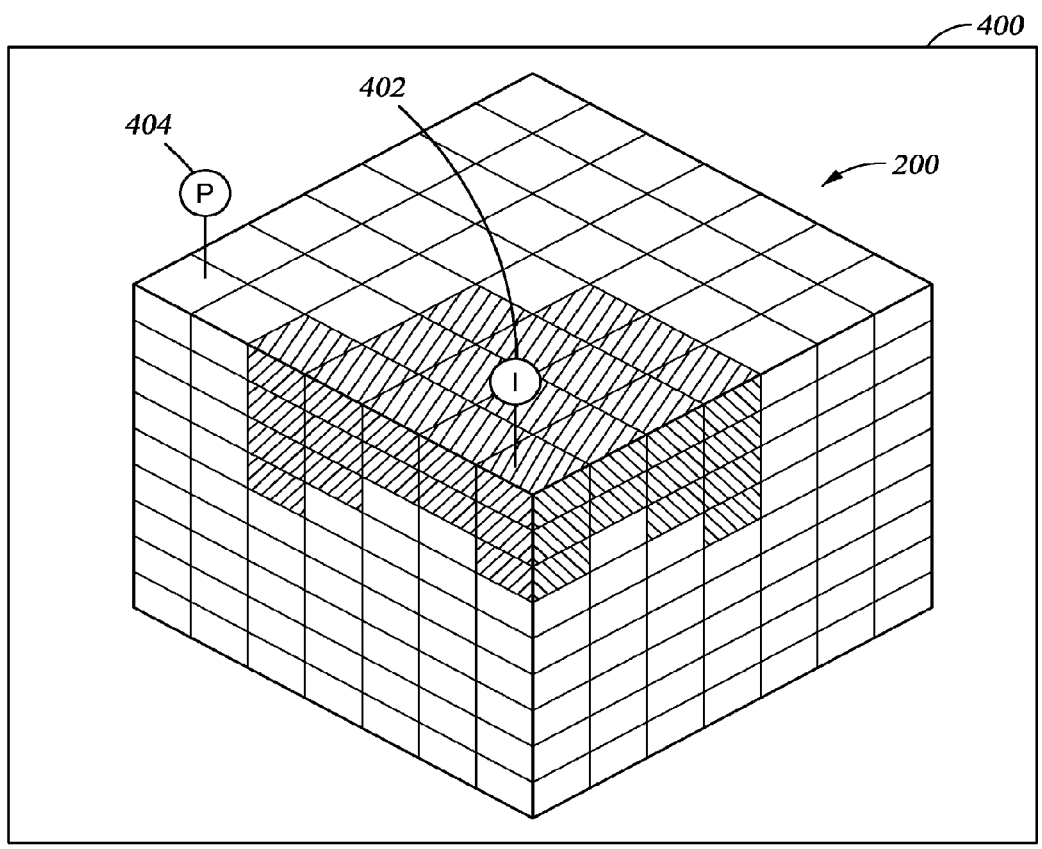
FIG. 4 shows a plot of the state of a geocellular model in accordance with at least some embodiments.

FIG. 4 shows a pane 400 of a display device showing a three-dimensional plot of at least a portion of the geocellular model 200. In particular, FIG. 4 illustratively shows the state of the geocellular model at the modeled time indicated by the datum 306 of the simulation 303. In practice, the three-dimensional plot in pane 400 may visually depict the state of the geocelluar model 200 by various colors within each cell. For example, colors tending toward the red end of the visible spectrum may be indicative of higher gas saturation (lower oil saturation), and colors tending towards the blue end of the visible spectrum may be indicative of higher oil saturation (lower gas saturation). Other color schemes, and other state information, may be equivalently shown. The state information in FIG. 4 is illustratively represented by shading. For example, the shaded cells may represent location of higher gas saturation, and the unshaded cells may represent locations of lower gas saturation. FIG. 4 also shows relative location of the simulated injection well 402 and production well 404. Any of a variety of commercially available software packages may be used to produce the illustrative three-dimensional plot of the state of the geocellular model, such as the NEXUS® View brand products available from Landmark Graphics Corporation of Houston, Tex.

In some situations, the software package used to plot and view the output data (such as FIG. 3) is distinct from the software package used to produce the three-dimensional plot of the state of the geocellular model (such as FIG. 4). Having different software packages as between the output data and plot of the state of the geocellular model is particularly likely when the analyst has hundreds or thousands of simulations runs to simultaneously analyze. The distinction with respect to software packages used to view output data, and software packages used to view the state of a geocellular model, may be true even in situations where the same company produces both software packages. Thus, invoking the software package to produce the three-dimensional plot illustrated in FIG. 4 at a particular point in modeled time represented by a datum in the two-dimensional plot as illustrated in FIG. 3 is time consuming and cumbersome. However, in accordance with the various embodiments the software packages are linked such that invoking the software package to show the three-dimensional plot of the state of the geocellular model is based on actions with respect to the cursor interacting with the two-dimensional plots of the output data. The specification first discusses interaction techniques of the user in the two-dimensional plot of the output data that results in actions with respect to the three-dimensional plot of the underlying state of the geocellular model, and then the specification turns to illustrative mechanisms of how to implement such a system.

Still referring to FIGS. 3 and 4, illustrative pane 300 of FIG. 3 may be shown on a display device of a computer system. Likewise, the illustrative pane 400 of illustrative FIG. 4 may be shown on a display device of a computer system. In some cases, the illustrative panes 300 and 400 may reside on a single display device. In yet still other cases pane 300 may reside on a first display device and pane 400 may reside on a second, distinct display device, but with each display device coupled to the same underlying computer system. In accordance with the various embodiments, the cursor of the computer system is used to identify a datum in the two-dimensional plot of the output data in pane 300 for which a three-dimensional plot of the underlying state of the geocellular model should be displayed. In particular, FIG. 3 illustrates a cursor 320. The position of the cursor relative to the two-dimensional plot in pane 300 may be changed based on interaction of a user with a pointing device (such as a mouse or game controller, discussed more below). In some embodiments, when the cursor 320 overlays a particular datum in the two-dimensional plot, the computer system displays a three-dimensional plot of the state of the geocellular model 200 in pane 400 at the modeled time indicated by the particular datum. For example, when the cursor is in the position indicated by illustrative cursor 320A, the system identifies not only simulation 303, but also the datum 306 (and more particularly the modeled time indicated by datum 306), and thereafter invokes the software package responsible for producing the three-dimensional plot to display the state of the geocellular model 200 at the corresponding modeled time. In a particular embodiment, the mere act of the cursor overlaying the particular datum is sufficient to invoke the software package responsible for producing the three-dimensional plot in pane 400. In another embodiment, additional user action may signify the desire to show the underlying state of the geocellular model, such as overlaying the cursor 320 and performing a "click" operation using a button on the mouse. In yet still further embodiments the user may select (e.g., by way of a drop down menu) whether the mere location, or location and further action, are used to signify the desire to show the state of the geocellular model.

Before proceeding, it should be understood that the selection of the particular datum 306 in the simulation 303 is merely illustrative. The overlaying of any datum in the simulation 303 will likewise result in displaying the state of the geocellular model at the respective point in modeled time in the pane 400. Moreover, any particular datum in either of the illustrative simulations 301 or 302 may likewise be selected such that the state of the geocellular model at that particular point in the model time may be shown.

The ability to quickly and efficiently generate a three-dimensional plot of the state of the geocellular model for any desired datum in the two-dimensional plot of the output data alone provides a significant time savings over the related art. However, while the analyst may glean much information from a static visual depiction of the state of the geocellular model at a particular modeled time (indicated by a particular output datum), in other situations it may be the change in the state of the geocellular model across a consecutive series of modeled times which provides further useful information to the analyst.

In accordance with the yet still further embodiments, the interaction between the software package that produces the two-dimensional plot in pane 300 and the software package that produces the three-dimensional plot in pane 400 are further linked such that the user may quickly and easily define a span of modeled time over which changes in the state of the geocellular model may be shown. Stated otherwise, the further embodiments provide a mechanism to select a span of modeled time over which the changes in state of the geocellular model may be animated.

In particular, in a particular embodiment moving the cursor 320 over a series of output datums associated with a simulation in the two-dimensional plot of the output data in illustrative pane 300 results in animation of the changes in state of the geocellular model over the period of time represented by the first datum encountered and the last datum encountered. For example, placing the illustrative cursor over datum 308, and then moving the cursor successfully over datums 310, 312 and 314 (i.e., the movement of the cursor over the data, as illustrated by cursor 320B position to cursor 320C position), identifies four illustrative datums spanning a period of modeled time indicated, at least in part, by the modeled time associated with datum 308 and ending with the modeled time associated with datum 314. In accordance with these further embodiments, the successive overlaying of the cursor over the output data results in successively displaying the state of the geocellular model for each selected datum in the illustrative pane 400. The successive displaying of the state of the geocellular model has the effect or appearance of an animation of the progression of changes of the state of the geocellular model 200.

In a particular embodiment, the animation of the three-dimensional plot of the state of the geocellular model 200 may be created in real time with the cursor 320 progressing successively along output data. In other embodiments, however, moving the cursor along successive data in the two-dimensional plot in pane 300 may be a data gathering step, and once the cursor movement stops and the final modeled time as identified, the animation may proceed in the pane 400 based on the identified beginning and ending modeled times. Further still, while in some cases the analyst may glean the best information by watching the progression in the underlying state of the formation model going forward in modeled time, in yet still other cases the cursor 320 may be passed successively over output data beginning with a datum associated with a later modeled time to an earlier modeled times, and thus the animation may likewise animate the changes backward in modeled time. The specification now turns to illustrative mechanisms to implement the various embodiments.

Figure 5:
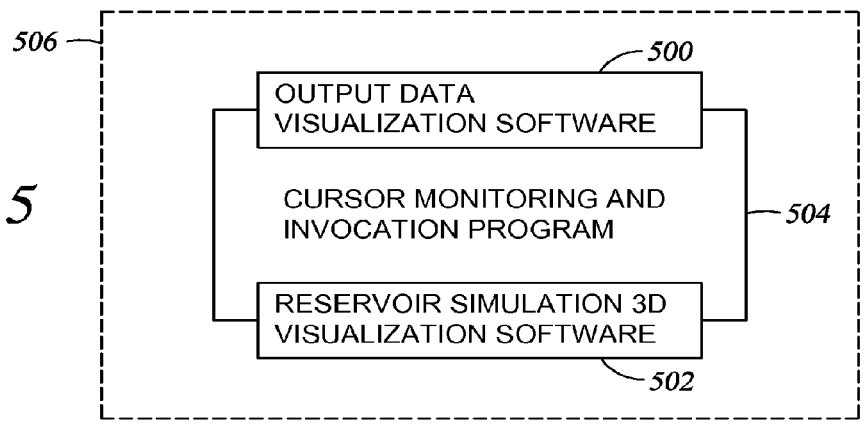
FIG. 5 shows a software environment in accordance with at least some embodiments.

As discussed above, the software package that creates the two-dimensional plot of the output data in illustrative pane 300 need not be produced by the same software company as the software package that creates the three-dimensional plot of the state of the geocellular formation model in illustrative pane 400. In situations where the software packages are distinct (whether from the same or different software companies), the various embodiments may be implemented by a software program that monitors cursor position with respect to the first software package, and invokes the second software package to show the three-dimensional plot of the state of the geocellular model. FIG. 5 illustrates such a software environment. In particular, FIG. 5 shows an output data visualization software package 500, such as the SPOTFIRE® brand products discussed above. The output data visualization software package 500 may be used to create the two-dimensional plots of output data such as shown in illustrative pane 300. Likewise, FIG. 5 shows a reservoir simulation 3D visualization software package 502, such as the NEXUS® View brand products discussed above. The visualization software 502 produces the three-dimensional plots of the state of the geocellular model as shown in pane 400. FIG. 5 further illustrates a cursor monitor and invocation program 504 which monitors the cursor position with respect to a plot of output data created by the visualization software 500. When the invocation program 504 detects that the cursor has overlaid a particular datum of a set of the output data, the invocation program 504 invokes visualization software 502 to display a three-dimensional plot of the state of the geocellular model at the modeled time indicated by the datum.

The amount of interaction between the invocation program 504 and the respective visualization software 500 and 502 may vary. In cases where the invocation program 504 is produced by a different software company than the software company that produces either the visualization software 500 or the visualization software 502, the interaction of the invocation program 504 with the visualization software 500 may be purely passive. For example, for visualization software 500 not specifically designed to perform the various embodiments discussed herein, placement of a cursor over a particular datum of output data may result in a small pop-up window that provides identifying information regarding the datum, such as the simulation to which the datum is associated, the particular value of hydrocarbon production represented by the datum, as well as the particular modeled time indicated by the datum. The invocation program 504, operating distinct from the visualization software 500, may read the data from the pop-up window (e.g., by reading the data from video memory for the pop-up window, by monitoring reads to a data area associated with the visualization program 500, by identifying a processor thread invoked to create the pop-up window). In yet still further embodiments, the invocation program 504 and visualization software 500 may be more tightly integrated, where the particular datum identified, or successive datums identified, may be conveyed by inter-process communication to the invocation program 504.

Still referring to FIG. 5, there may be many levels of interaction between the invocation program 504 and the visualization software 502. In cases where the invocation program 504 is produced by different software company than the visualization software 502, the only interaction between the invocation program 504 and visualization software 502 may be a command line-style invocation, where the visualization software 502 is invoked and passed parameters that identify the data file or series of data files to be plotted in illustrative pane 400. In other cases, the invocation program 504 and visualization software 502 may be very closely integrated such that the invocation program 504 has the capability of invoking specific executables that make up the software package to precipitate creation of the three-dimensional plot of the state of the geocellular model 200.

The various embodiments discussed to this point have assumed that the output data visualization software 500 that produces the two-dimensional plot of the output data, and the reservoir simulation 3D visualization software 502 that produces the three-dimensional plot of the state of the geocellular model, are produced by different software companies. However, in other embodiments the visualization software 500 and visualization software 502 are produced by the same software company (or are products that are easily integrated if from different software companies) and thus the invocation program 504 may likewise reside within the same overall software package, as illustrated by dashed line 506.

Figure 6:
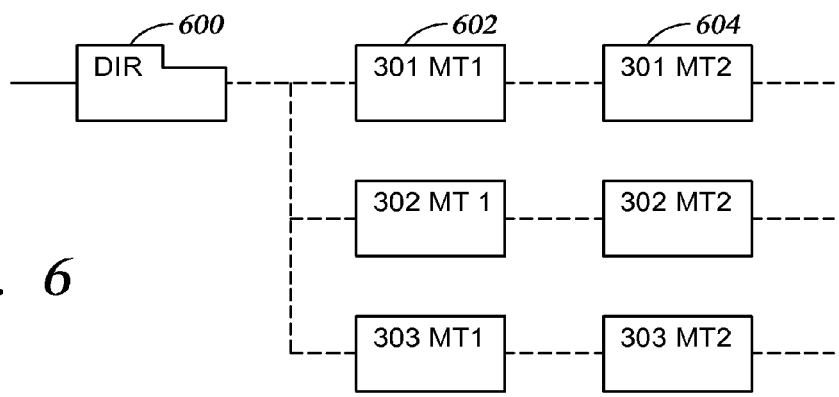
FIG. 6 shows an organizational system in accordance with at least some embodiments.

The mechanism by which the invocation program 504 identifies a location where data for a particular simulation modeled time resides may likewise take many possible forms. That is, while the invocation program 504 may determine the identity of a simulation and particular modeled time from the visualization software 500, such identification does not necessarily include information as to where on the computer system the underlying data for the state of the geocellular model resides. One illustrative form to identify the location may be by way of a file naming convention. In particular, the underlying data representing the state of the geocellular model for any simulation at any particular modeled time may be identifiable based on a file name. FIG. 6 illustrates such a situation. In particular, in embodiments utilizing the organizational structure shown by FIG. 6, the data files that contain the state of the geocellular model at each modeled time reside in directory 600. In such a case, the file names themselves identify not only the simulation, but also the modeled time to which the data corresponds. For example, a first file 602 may have a file name of "301MT1", illustratively representing that the data in the file is from simulation 301 at modeled time 1. Likewise, illustrative file 604 may contain the data representing the state of the geocellular model from simulation 301 at modeled time 2. Thus, in embodiments using the organizational structure shown in FIG. 6, the invocation program 504, after identifying the particular datum for which the analyst wishes to see a visualization of the state of the geocellular model, the invocation program 504 invokes the visualization software 502 along with the parameter to identify the directory 600 and specific file names of interest. Further organizational schemes are possible, including having all of the data representing the state of the geocellular model for all modeled times for a simulation in a single file name, and thus the modeled time representing an index into the data.

Figure 7:
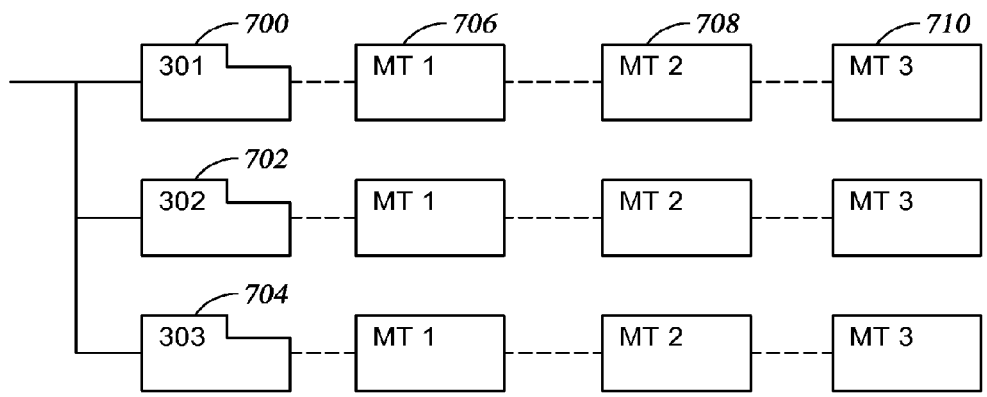
FIG. 7 shows an organizational system in accordance with at least some embodiments.

In yet still further embodiments, the organizational structure may place more emphasis on the directory structure. FIG. 7 illustrates an organizational scheme where the data representing the state of the underlying formation model for each simulation is separated into individual directories. In the illustrative organizational scheme shown in FIG. 7, a directory 700, 702 and 704 is utilized for each simulation run 301, 302 and 303, respectively. Within each directory resides one or more files that contain the data representing the state of geocellular model for plurality of modeled times. For example, directory 301 may contain a plurality of files 706, 708, and 710, with each file containing data regarding the state of the geocellular model at a particular modeled time.

The file name-based organizational system illustrated in FIG. 6, and the directory-based organizational system illustrated in FIG. 7, are merely illustrative. Other systems may be equivalently used. For example, the input data, output data and state data may be stored in an object oriented database, or a relational database. Regardless of the precise system under which the data are stored and identified, the analyst or user will no longer need to know the precise storage locations of the data. One having ordinary skill in the art, now understanding the two-dimensional to three-dimensional visualization system described herein, as well as the illustrative organizational systems, could devise other organizational systems for identifying particular state of the geocellular model and passing that such information to the visualization software 502.

Figure 8:
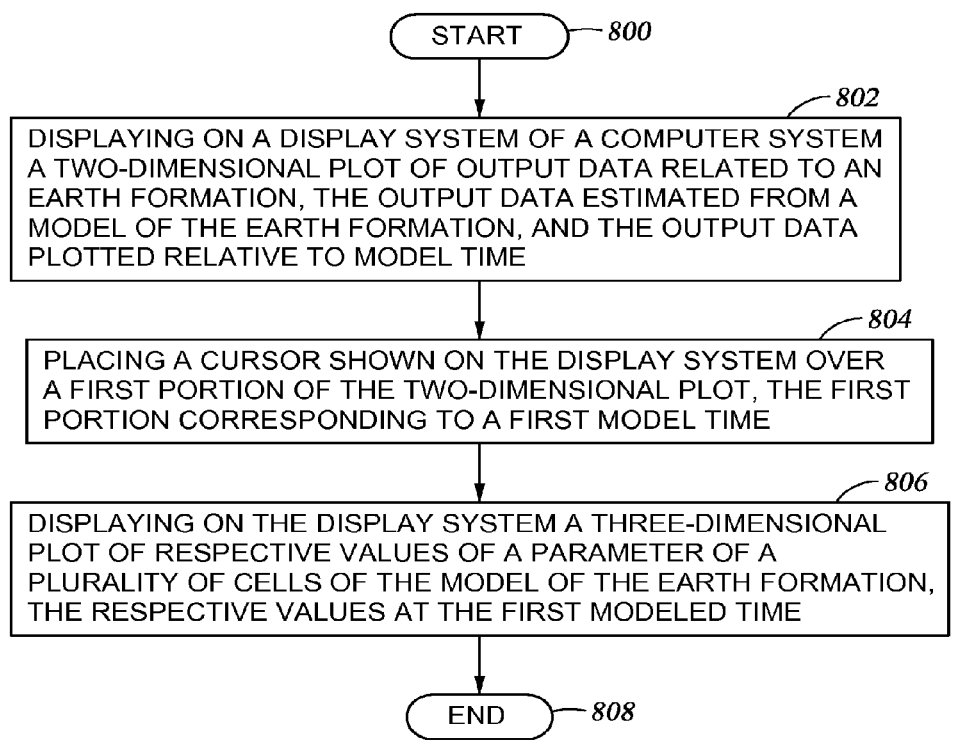
FIG. 8 shows a method in accordance with at least some embodiments.

FIG. 8 shows a method in accordance with at least some embodiments. In particular, the method starts (block 800) and comprises: displaying on a display system of a computer system a two-dimensional plot of output data related to an earth formation, the output data estimated from a model of the earth formation, and the volume plotted relative to modeled time (block 802); placing a cursor shown on the display system over a first portion of the two-dimensional plot, the first portion corresponding to a first modeled time (block 804); and thereby displaying on the display system a three-dimensional plot of respective values of a parameter of a plurality of cells of the model of the earth formation, the respective values at the first modeled time (block 806). Thereafter, the method ends (block 808).

Figure 9:
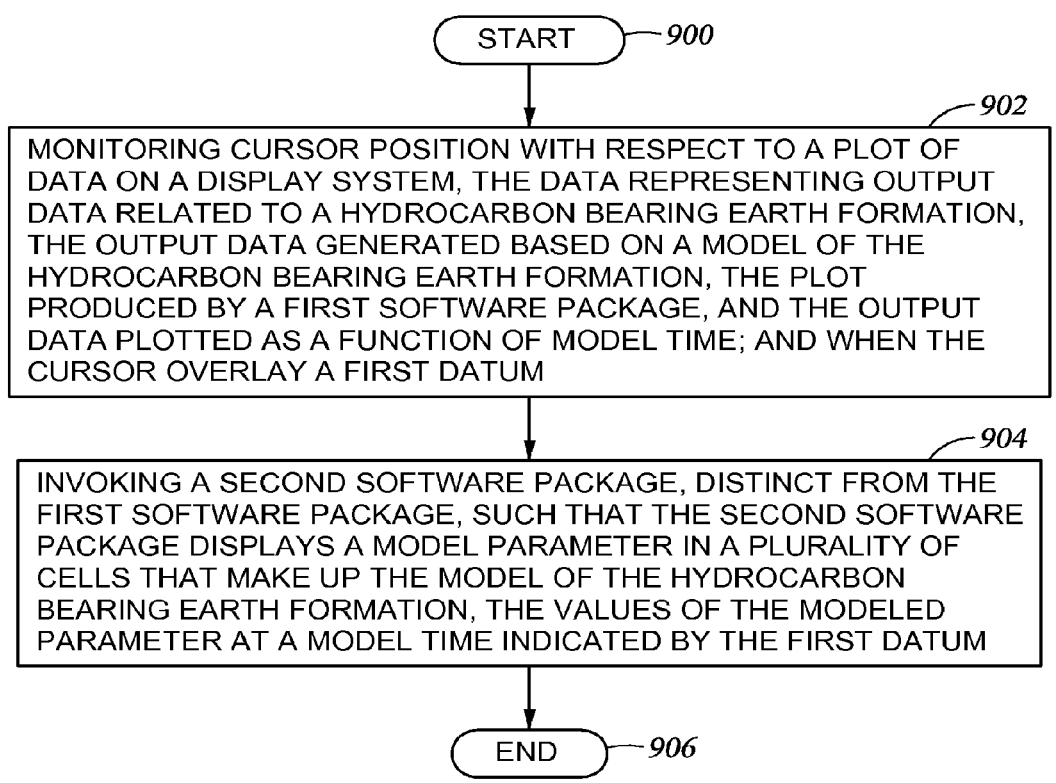
FIG. 9 shows a method in accordance with at least some embodiments.

FIG. 9 shows a method (software) in accordance with at least some embodiments. In particular, the method starts (block 900) and comprises: monitoring cursor position with respect to a plot of data on a display system, the data representing output data related to a hydrocarbon bearing earth formation, the output data generated based on a model of the hydrocarbon bearing earth formation, the plot produced by a first software package, and the output data plotted as a function of modeled time (block 902); and when the cursor overlays a first datum invoking a second software package, distinct from the first software package, such that the second software package displays a modeled parameter in a plurality of cells that make up the model of the hydrocarbon bearing earth formation, the values of the modeled parameter at a modeled time indicated by the first datum (block 904). Thereafter, the method ends (block 906).

Figure 10:
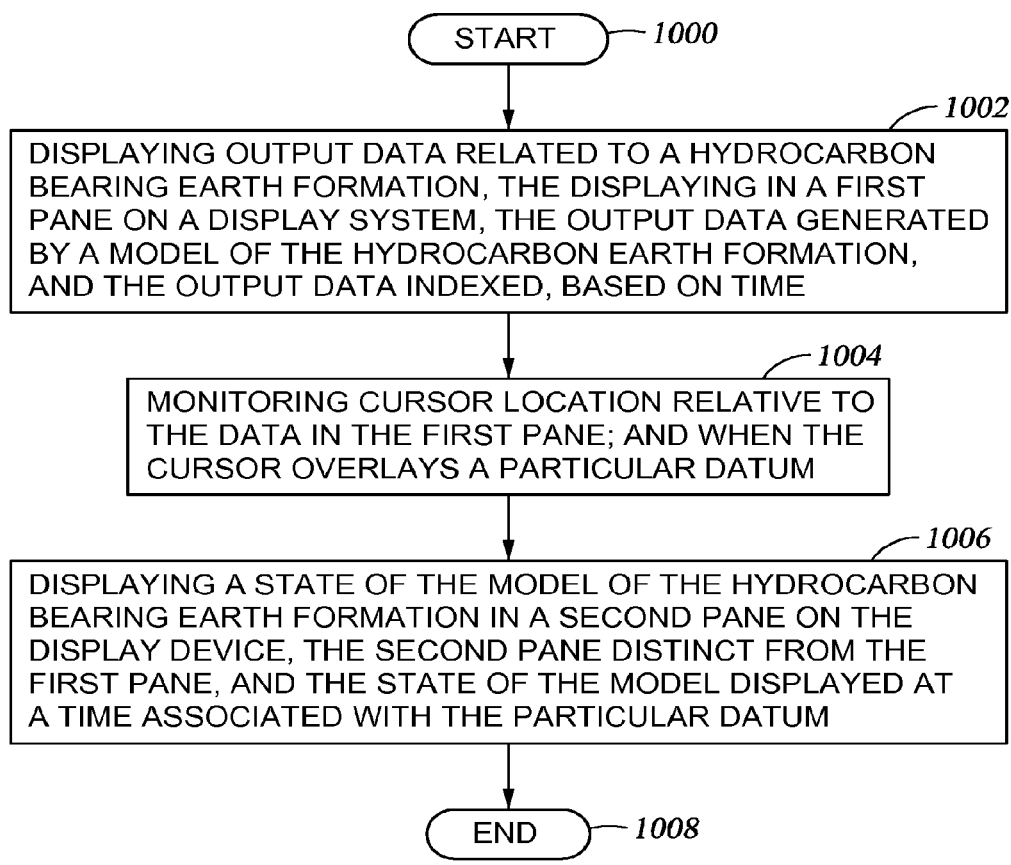
FIG. 10 shows a method in accordance with at least some embodiments.

FIG. 10 shows a method (software) in accordance with at least some embodiments. In particular, the method starts (block 1000) and comprises: displaying output data related to a hydrocarbon bearing earth formation, the displaying in a first pane on a display system, the output data generated by a model of the hydrocarbon earth bearing formation, and the output data index based on time (block 1002); monitoring cursor location relative to the data in the first pane (block 1004); and when the cursor overlays a particular datum displaying a state of the model of the hydrocarbon bearing earth formation in a second pane on the display device, the second pane distinct from the first pane, and the state of the model displayed at a time associated with the particular datum (block 1006). Thereafter, the method ends (block 1008).

Figure 11:
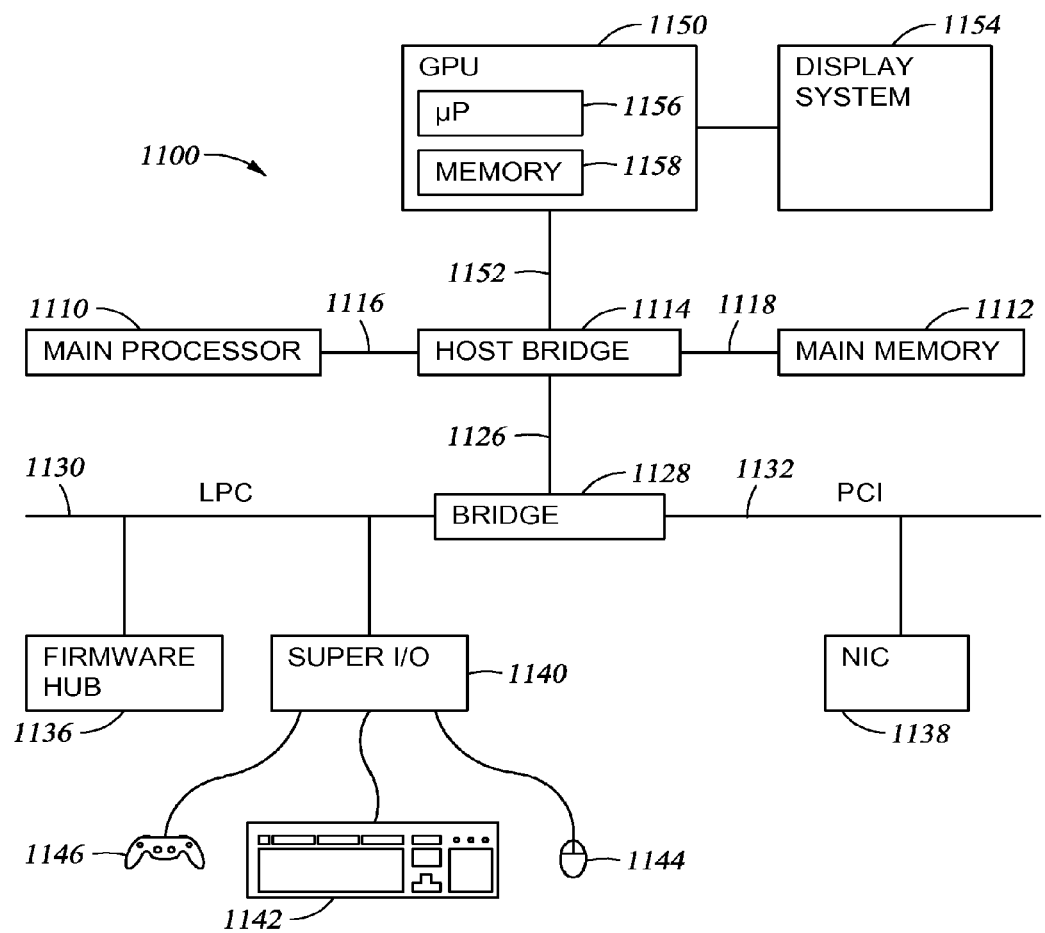
FIG. 11 shows a computer system in accordance with at least some embodiments.

FIG. 11 illustrates a computer system 1100 in accordance with at least some embodiments. In particular, computer system 1100 comprises a main processor 1110 coupled to a main memory array 1112, and various other peripheral computer system components, through integrated host bridge 1114. The main processor 1110 may be a single processor core device, or a processor implementing multiple processor cores. Furthermore, computer system 1100 may implement multiple main processors 1110. The main processor 1110 couples to the host bridge 1114 by way of a host bus 1116 or the host bridge 1114 may be integrated into the main processor 1110. Thus, the computer system 1100 may implement other bus configurations or bus-bridges in addition to, or in place of, those shown in FIG. 11.

The main memory 1112 couples to the host bridge 1114 through a memory bus 1118. Thus, the host bridge 1114 comprises a memory control unit that controls transactions to the main memory 1112 by asserting control signals for memory accesses. In other embodiments, the main processor 1110 directly implements a memory control unit, and the main memory 1112 may couple directly to the main processor 1110. The main memory 1112 functions as the working memory for the main processor 1110 and comprises a memory device or array of memory devices in which programs, instructions and data are stored. The main memory 1112 may comprise any suitable type of memory such as dynamic random access memory (DRAM) or any of the various types of DRAM devices such as synchronous DRAM (SDRAM), extended data output DRAM (EDO-DRAM), or Rambus DRAM (RDRAM). The main memory 1112 is an example of a non-transitory computer-readable medium storing programs and instructions, and other examples are disk drives and flash memory devices.

The illustrative computer system 1100 also comprises a second bridge 1128 that bridges the primary expansion bus 1126 to various secondary expansion buses, such as a low pin count (LPC) bus 1130 and peripheral components interconnect (PCI) bus 1132. Various other secondary expansion buses may be supported by the bridge device 1128. In accordance with some embodiments, the bridge device 1128 comprises an Input/Output Controller Hub (ICH) manufactured by Intel Corporation, and thus the primary expansion bus 1126 comprises a Hub-link bus, which is a proprietary bus of the Intel Corporation. However, computer system 1100 is not limited to any particular chip set manufacturer, and thus bridge devices and expansion bus protocols from other manufacturers may be equivalently used.

Firmware hub 1136 couples to the bridge device 1128 by way of the LPC bus 1130. The firmware hub 1136 comprises read-only memory (ROM) which contains software programs executable by the main processor 1110. The software programs comprise programs executed during and just after power on self tests (POST) procedures as well as memory reference code. The POST procedures and memory reference code perform various functions within the computer system before control of the computer system is turned over to the operating system.

The computer system 1100 further comprises a network interface card (NIC) 1138 illustratively coupled to the PCI bus 1132. The NIC 1138 acts as to couple the computer system 1100 to a communication network, such the Internet.

Still referring to FIG. 11, computer system 1100 may further comprise a super input/output (I/O) controller 1140 coupled to the bridge 1128 by way of the LPC bus 1130. The Super I/O controller 1140 controls many computer system functions, for example interfacing with various input and output devices such as a keyboard 1142, a pointing device 1144 (e.g., mouse), game controller 1146, various serial ports, floppy drives and disk drives. The super I/O controller 1140 is often referred to as "super" because of the many I/O functions it performs.

The computer system 1100 further comprises a graphics processing unit (GPU) 1150 coupled to the host bridge 1114 by way of bus 1152, such as a PCI Express (PCI-E) bus or Advanced Graphics Processing (AGP) bus. Other bus systems, including after-developed bus systems, may be equivalently used. Moreover, the graphics processing unit 1150 may alternatively couple to the primary expansion bus 1126, or one of the secondary expansion buses (e.g., PCI bus 1132). The graphics processing unit 1150 couples to a display system 1154 which may comprise any suitable electronic display device or multiple distinct display devices, upon which any image or text can be displayed. The graphics processing unit 1150 comprises an onboard processor 1156, as well as onboard memory 1158. The processor 1156 may thus perform graphics processing, as commanded by the main processor 1110. Moreover, the memory 1158 may be significant, on the order of several hundred megabytes or more. Thus, once commanded by the main processor 1110, the graphics processing unit 1150 may perform significant calculations regarding graphics to be displayed on the display system, and ultimately display such graphics, without further input or assistance of the main processor 1110.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments, and/or to create a non-transitory computer-readable storage medium (i.e., other than an signal traveling along a conductor or carrier wave) for storing a software program to implement the method aspects of the various embodiments.

The above discussion is meant to be illustrative of the principles and various embodiments of the present invention. Numerous variations and modifications will become apparent to those skilled in the art once the above disclosure is fully appreciated. For example, while the illustrative output data discussed was volume of hydrocarbons indexed as function of modeled time, any of a variety of output data can be plotted indexed against any available parameter (e.g., porosity, permeability, secondary recovery fluid injection rate, oil saturation, gas saturation). Moreover, in some cases the output data have shorter time steps (e.g., days, hours) than the time steps associated with the state of the geocellular model (e.g., weeks, months), and thus selecting a particular datum in the output data may result in display of the state of the geocelluar at a modeled time most closely associated with the particular datum, but not necessarily at the precise point in modeled time. It is intended that the following claims be interpreted to embrace all such variations and modifications.

I claim:

1. A computer system comprising:
a processor;
a memory device coupled to the processor;
a pointing device coupled to the processor;
a display device coupled to the processor, the display device showing a cursor whose position is based on position data generated by the pointing device;
the memory device stores a program that, when executed by the processor, causes the processor to:
perform a simulation using an earth model of a hydrocarbon bearing formation over a plurality of modeled times;
store output data from the simulation for each of the plurality of modeled times in association with a state of the earth model at that modeled time;
display the output data relative to the plurality of modeled times in a first pane on the display device;
monitor the position of the cursor on the display device relative to the displayed output data in the first pane;
when the monitored position of the cursor overlays a particular datum in the displayed output data for a particular modeled time, identify the state of the earth model at the particular modeled time associated with the particular datum in the stored output data; and display, in a second pane on the display device distinct from the first pane, the identified state of the earth model at the particular modeled time associated with the particular datum.

2. The computer system of claim 1 wherein when processor displays the output data, the program causes the processor to display the output data in a two-dimensional graph.

3. The computer system of claim 1 wherein when the processor displays the state of the earth model, the program causes the processor to display the state of the earth model as a three-dimensional plot.

4. The computer system of claim 1 wherein when processor displays the output data, the program causes the processor to display at least one selected from the group consisting of: hydrocarbon production as a function of modeled time; water production as a function of modeled time; natural gas production as a function of modeled time; oil production as a function of modeled time; and production of a secondary recovery fluid as a function of modeled time.

5. The computer system of claim 1 wherein when the processor displays the state of the earth model, the program causes the processor to display an indication of a modeled parameter in a plurality of abutting cells.

6. The method of claim 3 wherein displaying the three-dimensional plot further comprises displaying colors near the red end of the visible spectrum, wherein the red end is indicative of a higher gas saturation.

7. The method of claim 3 wherein displaying the three-dimensional plot further comprises displaying colors near the red end of the visible spectrum, wherein the red end is indicative of a lower oil saturation.

8. The method of claim 3 wherein displaying the three-dimensional plot further comprises displaying colors near the blue end of the visible spectrum, wherein the red end is indicative of a lower gas saturation.

9. The method of claim 3 wherein displaying the three-dimensional plot further comprises displaying colors near the blue end of the visible spectrum, wherein the red end is indicative of a higher oil saturation.

10. A method comprising:
performing a simulation using an earth model of a hydrocarbon bearing formation over a plurality of modeled times;
storing output data from the simulation for each of the plurality of modeled times in association with a state of the earth model at that modeled time, the state of the earth model including values of at least one modeled parameter for a plurality of cells of the earth model at the modeled time;
displaying on a display device of a computer system, visual representation of the output data relative to the plurality of modeled times;
monitoring a position of a cursor shown on the display device relative to the displayed visual representation of the output data;
when the monitored position of the cursor overlays a portion of the displayed visual representation corresponding to a particular datum of the output data at a particular modeled time, identifying the state of the earth model at the particular modeled time associated with the particular datum in the stored output data; and
displaying on the display device a visual representation of the values of the modeled parameter from the plurality of cells of the earth model, based on the identified state of the earth model at the particular modeled time associated with the particular datum.

11. The method of claim 10 wherein the modeled parameter is at least one selected from the group consisting of: porosity, permeability, saturation, and rate of injection.

12. The method of claim 10 wherein the visual representation of the output data is a two-dimensional plot and the visual representation of the values of the modeled parameter is a three-dimensional plot.

13. The method of claim 12, wherein the values of the modeled parameter are displayed within the three-dimensional plot using at least one of a plurality of colors or a plurality of different shading densities.

14. A non-transitory computer-readable medium storing a program that, when executed by a processor, causes the processor to:
perform a simulation using an earth model of a hydrocarbon bearing formation over a plurality of modeled times;
store output data from the simulation for each of the plurality of modeled times in association with a state of the earth model at that modeled time, the state of the earth model including values of at least one modeled parameter for a plurality of cells of the earth model at the modeled time;
invoke a first software package to display a plot of the output data relative to the plurality of modeled times on a display device of a computer system;
monitor a cursor position relative to the plot of the output data as displayed on the display device;
when the monitored cursor position overlays a portion of the plot corresponding to a first datum of the output data at a first modeled time, identify the state of the earth model at the first modeled time associated with the first datum in the stored output data; and
invoke a second software package, distinct from the first software package, such that the second software package displays the values of the modeled parameter from the plurality of cells of the earth model, based on the identified state of the earth model at the first modeled time associated with the first datum.

15. The non-transitory computer-readable medium of claim 14 wherein when the processor invokes the second software package, the program further causes the processor to invoke the second software package such that the second software packages displays the plurality of cells as a three dimensional plot.

16. The non-transitory computer-readable medium of claim 14 further comprising:
wherein when the processor monitors, the program further causes the processor to monitor movement of the cursor as the cursor successively overlays portions of the plot corresponding to a second datum and a third datum of the output data at respective second and third modeled times; and
wherein when the processor invokes the second software package, the program causes the processor to animate the state of the earth model over a span of the modeled time associated with the first through third datums.

17. A non-transitory computer-readable medium storing a program that, when executed by a processor, causes the processor to:
perform a simulation using a model of a hydrocarbon bearing formation over a plurality of modeled times;
store output data from the simulation for each of the plurality of modeled times in association with a state of the model at that modeled time;
display the output data relative to the plurality of modeled times in a first pane on a display device;

monitor a position of a cursor on the display device relative to the displayed output data in the first pane;

when the monitored position of the cursor overlays a particular datum in the displayed output data for a particular modeled time, identify the state of the model at the particular modeled time associated with the particular datum in the stored output data; and display, in a second pane on the display device, the identified state of the model at the particular modeled time associated with the particular datum.

18. The non-transitory computer-readable medium of claim 17 wherein when processor displays the output data, the program causes the processor to display the output data in a two-dimensional graph.

19. The non-transitory computer-readable medium of claim 17 wherein when the processor displays the state of the model, the program causes the processor to display the state of the model as three-dimensional plot.

20. The non-transitory computer-readable medium of claim 17 wherein when processor displays the output data, the program causes the processor to display at least one selected from the group consisting of: hydrocarbon production as a function of modeled time; water production as a function of modeled time; natural gas production as a function of modeled time; oil production as a function of modeled time; production of a secondary recovery fluid as a function of modeled time.

21. The non-transitory computer-readable medium of claim 17 wherein when the processor displays the state of the model, the program causes the processor to display values of a modeled parameter for a plurality of cells that make up the model.

* * * * *